(12) United States Patent
Du et al.

(10) Patent No.: US 9,475,970 B2
(45) Date of Patent: Oct. 25, 2016

(54) EPOXY RESIN COMPOSITION AND COPPER CLAD LAMINATE MANUFACTURED BY USING SAME

(75) Inventors: Cuiming Du, Guangdong (CN); Songgang Chai, Guangdong (CN); Zhongqiang Yang, Guangdong (CN)

(73) Assignee: GUANGDONG SHENGYI SCI. TECH CO., LTD., Guangdong (CN)

( * ) Notice: Subject to any disclaimer, the term of this patent is extended or adjusted under 35 U.S.C. 154(b) by 308 days.

(21) Appl. No.: 13/821,630

(22) PCT Filed: Sep. 2, 2011

(86) PCT No.: PCT/CN2011/079280
§ 371 (c)(1),
(2), (4) Date: Jul. 23, 2013

(87) PCT Pub. No.: WO2012/031537
PCT Pub. Date: Mar. 15, 2012

(65) Prior Publication Data
US 2013/0295388 A1 Nov. 7, 2013

(30) Foreign Application Priority Data
Sep. 8, 2010 (CN) .......................... 2010 1 0283828

(51) Int. Cl.
*B32B 27/38* (2006.01)
*C09J 163/00* (2006.01)
(Continued)

(52) U.S. Cl.
CPC ............... *C09J 163/00* (2013.01); *B32B 7/12* (2013.01); *B32B 15/043* (2013.01); *B32B 15/14* (2013.01);
(Continued)

(58) Field of Classification Search
None
See application file for complete search history.

(56) References Cited

U.S. PATENT DOCUMENTS

| 4,501,787 A | 2/1985 | Marchetti et al. |
| 2006/0135710 A1* | 6/2006 | Shirrell .......... 525/481 |

(Continued)

FOREIGN PATENT DOCUMENTS

| CN | 101039546 A | 9/2007 |
| GB | 2211852 * | 7/1989 |

(Continued)

OTHER PUBLICATIONS

Huang et al., Chemical surface treatment of poly(tetrafluoroethylene), Die Angewandte Makrornolekulare Chemie 209 (1993) 9-23 (Nr. 3588).*

(Continued)

*Primary Examiner* — Coris Fung
(74) *Attorney, Agent, or Firm* — Norton Rose Fulbright US LLP

(57) ABSTRACT

The present invention relates to an epoxy resin composition and a copper clad laminate manufactured by using same. The epoxy resin composition comprises the following components and weight percentages thereof: epoxy resin 20-70%, curing agent 1-30%, accelerator 0-10%, fluororesin micropowder filler 1-60% and inorganic filler 0-60%, and further comprises a suitable amount of solvent. The copper clad laminate manufactured by using the epoxy resin composition comprises a prepreg and copper foils covering two sides of the prepreg, the prepreg comprising a reinforced material and the epoxy resin composition, which is adhered to the reinforced material after dipping and drying. The copper clad laminate manufactured by using the epoxy resin composition has excellent comprehensive performance, low water absorption, conductive anodic-filament resistance and good processability and meets requirements for processing an assembling of printed circuit boards.

5 Claims, 3 Drawing Sheets

(51) Int. Cl.
| | |
|---|---|
| *H05K 1/03* | (2006.01) |
| *C08L 63/00* | (2006.01) |
| *B32B 7/12* | (2006.01) |
| *B32B 15/04* | (2006.01) |
| *C08L 27/12* | (2006.01) |
| *B32B 15/20* | (2006.01) |
| *B32B 17/04* | (2006.01) |
| *B32B 15/14* | (2006.01) |
| *H05K 3/02* | (2006.01) |

(52) U.S. Cl.
CPC ............... *B32B 15/20* (2013.01); *B32B 17/04* (2013.01); *C08L 27/12* (2013.01); *C08L 63/00* (2013.01); *H05K 1/0326* (2013.01); *B32B 2260/021* (2013.01); *B32B 2260/046* (2013.01); *B32B 2262/02* (2013.01); *B32B 2262/06* (2013.01); *B32B 2262/10* (2013.01); *B32B 2262/101* (2013.01); *B32B 2307/7265* (2013.01); *B32B 2457/08* (2013.01); *H05K 1/0373* (2013.01); *H05K 3/022* (2013.01); *Y10T 428/31522* (2015.04)

(56) References Cited

U.S. PATENT DOCUMENTS

| | | | |
|---|---|---|---|
| 2008/0308225 A1* | 12/2008 | Kanamaru et al. | 156/322 |
| 2009/0242116 A1* | 10/2009 | Pattekar et al. | 156/293 |
| 2010/0143728 A1* | 6/2010 | Tsuchikawa et al. | 428/457 |

FOREIGN PATENT DOCUMENTS

| | | |
|---|---|---|
| JP | 01-275686 A | 11/1989 |
| JP | 11-269350 A | 10/1999 |
| JP | 2010-023234 A | 2/2010 |

OTHER PUBLICATIONS

Gu, machine translation of CN 101039546. Sep. 19, 2007.*

* cited by examiner

EPOXY RESIN COMPOSITION AND COPPER CLAD LAMINATE MANUFACTURED BY USING SAME

This application is a §371 of International Application No. PCT/CN2011/079280 filed Sep. 2, 2011, and claims priority from Chinese Patent Application No. 201010283828.4 filed Sep. 8, 2010.

TECHNICAL FIELD

The present relates to a resin composition, especially an epoxy resin composition capable of decreasing the water absorption of the copper clad laminate, improving the processing performance thereof and increasing CAF-resistance, and a copper clad laminate manufactured by using the same.

BACKGROUND ART

With the rapid development of electrical and electronic industry in China, great infrastructure investment, there is a growing demand for high electrical insulating materials. Moreover, the requirements of the electronic products on water absorption of the base materials and the anti-GAF (conductive anodic-filament) performance are becoming more demanding. In order to meet such developing requirements, the traditional solving method for copper clad laminate is to develop according to the conventional process liar the production of copper clad lamination a resin composition having a low moisture absorption rate, impregnate the reinforced materials to obtain an insulating material having low moisture absorption, and cover electrolytic copper foils on one or both sides thereof to be laminated into a copper clad laminate.

Currently, increasing the crosslinking density and adding inorganic fillers are widely used to solve such problem. For example, U.S. Pat. No. 4,501,787 discloses, increasing the crosslinking density with phenolic resin to decrease the water absorption of the laminates, which, however, will affect the processability thereof.

JP2010023234A2 discloses adding inorganic fillers to decrease the water absorption and CTE of the laminates, which has a low cost and can decrease the water absorption to a certain extent. However, such method may obviously decrease the processability thereof.

CONTENTS OF THE INVENTION

The object of the present invention is to provide an epoxy resin composition, which may decrease the water absorption of the composite material or copper clad laminated manufactured by using the same, improve the processability of the laminates and increase the CAF-resistance.

Another object of the present invention lies in providing a copper clad laminate manufactured by using said epoxy resin composition, which has lower water absorption and better CAF-resistance, has a better processability and meets the requirements on the processing and assembling of printed circuit boards.

In order to achieve the objects above, the present invention provides an epoxy resin composition comprising the following components and weight percentages thereof: epoxy resin 20-70%, curing agent 1-30%, accelerator 0-10%, fluororesin micropowder filler 1-60%, and inorganic filler 0-60%, and further comprising a suitable amount of solvent.

The fluororesin of the fluororesin micropowder filler is the homopolymer of the monomer $-\!\!\!-\!\!(C_2F_xH_{4-x-y}Cl_y)\!\!\!-\!\!\!-_m$ or copolymer of $-\!\!\!-\!\!(C_2F_xH_{4-x-y}Cl_y)\!\!\!-\!\!\!-_m$ and $-\!\!\!-\!\!(C_aF_bH_c(OCH_3)_{2a-b-c})\!\!\!-\!\!\!-_n$, wherein x=1-4; y=0-3, m is an integer of greater than of equal to 1; a and n are the integers of greater than or equal to 1; b and c are the integers of greater than or equal to 0; 2−b−c>0.

Said fluororesin is tetrafluoroethylene resin, tetrafluoroethylene-perfluoro alkoxyethylene copolymer resin, tetrafluoroethylene-hexafluoropropylene copolymer resin, tetrafluoroethylene-ethylene copolymer resin, vinylidene fluoride resin, trifluorochloroethylene or ethylene-trifluorochloroethylene resin.

The fluororesin micropowder filler has an average particle size of 0.1-50 μm, preferably 0.5-20 μm.

The fluororesin micropowder filler is added in an amount of preferably 10-40%.

The fluororesin micropowder filler may be surface treated, wherein the surface treatment is selected from the group consisting of treatment with a fluorine-containing coupling agent, modification by molten potassium acetate or by sodium-naphthalene solution.

The solvent is at least selected from the group consisting of hexane, heptane, nonane, decane, dodecane, gasoline, kerosene and cyclohexanone.

Meanwhile, the present invention further provides a copper clad laminated manufactured by using the epoxy resin composition, including a prepreg and copper foils covering two sides of the prepreg, the prepreg comprising a reinforced material and the epoxy resin composition which is adhered to the reinforced material after dipping and drying.

The reinforced material is selected from the group consisting of natural fibers, organic synthetic fibers, organic fabrics and inorganic fibers.

The present invention has the following beneficial effect. The epoxy resin composition of the present invention is manufactured by adding the fluororesin micropowder filler, The resultant epoxy resin composition may notably decrease the water absorption of the composite material manufactured by using the same, improve the processability of the composite material, and increase the CAF-resistance of the composite material. In addition, the copper clad laminate manufactured by using such epoxy resin composition has excellent comprehensive performance, low water absorption, conductive anodic-filament resistance and good processability and meets requirements for processing an assembling of printed circuit boards.

DESCRIPTION OF THE FIGURES

In the figures.

EMBODIMENTS

Figure 1:
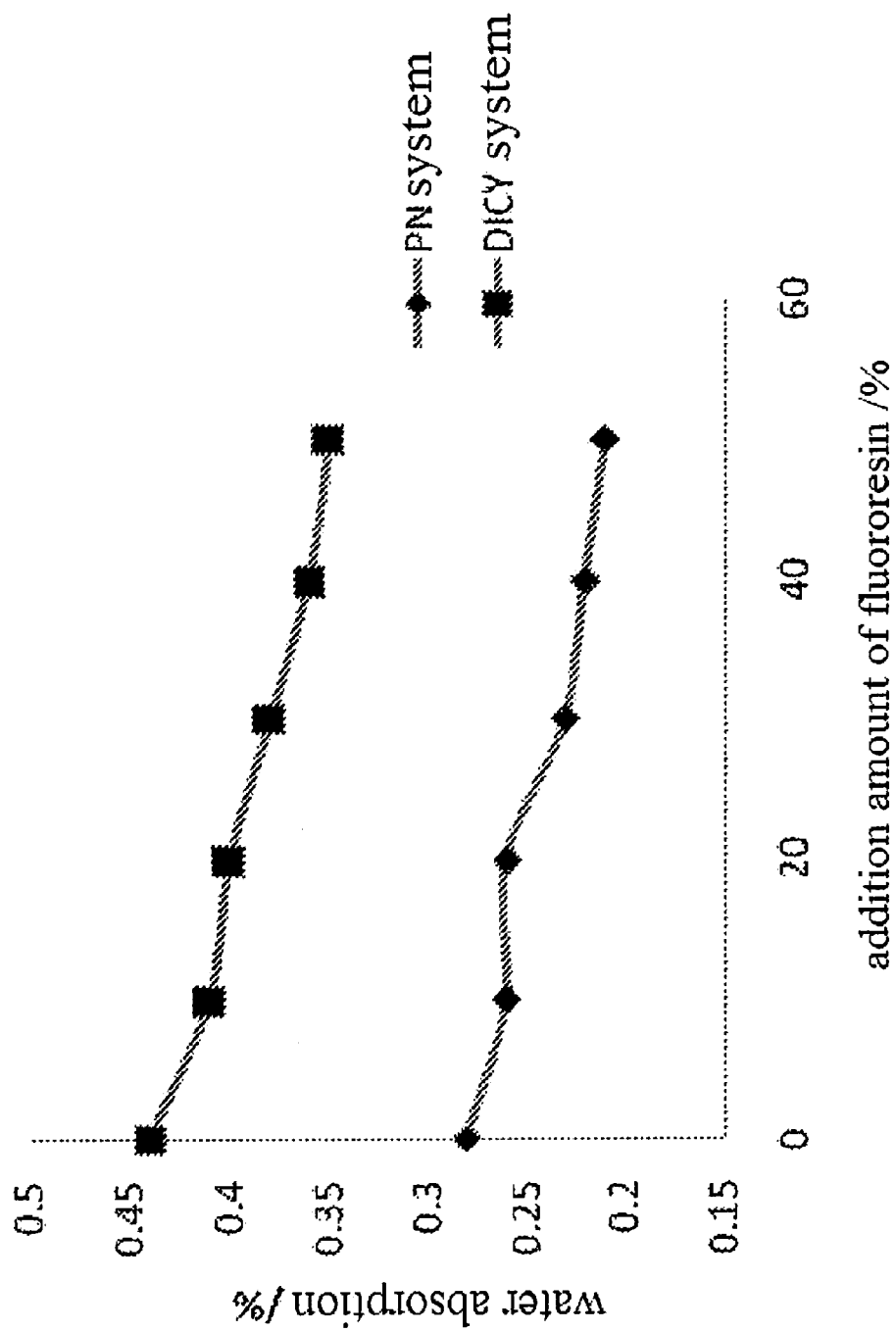
FIG. 1 shows the graphic chart of the relations between the water absorption of the copper clad laminate and the addition amount of the fluororesin micropowder filler.

The epoxy resin composition of the present invention comprises the following components and weight percentages thereof: epoxy resin 20-70%, curing agent 1-30%, accelerator 0-10%, fluororesin micropowder filler 1-60% and inorganic filler 0-60% and further comprises a suitable amount of solvent.

The epoxy resin is selected from the group consisting of biphenol A-type epoxy resin, biphenol F-type epoxy resin, biphenol S-type, biphenyl-type epoxy resin, naphthalene type epoxy resin, alicyclic type epoxy resin, phenol-phenolic aldehyde-type epoxy (shortened as PNE), orthocresol-phenolic aldehyde-type epoxy (shortened as PNE), biphenol A-phenolic aldehyde-type epoxy (shortened as BNE), resorcin-type epoxy resin, polyethyleneglycol type epoxy resin, trifunctional group epoxy resin, tetrafunctional group epoxy resin, epoxy resin cyclopentadiene or bicyclodiene and phenol condensation resin, brominated epoxy resin and the like, used alone or in combination.

The curing agent is dicyandiamide (DICY), 4,4-diaminodiphenyl sulphone (DDS) or phenolic resin. The accelerator is one or more selected from the group consisting of 2-methylimidazole, 1-methylimidazole, 2-ethyl-4-methylimidazole, 2-phenylimidazole, 2-hendecylimidazole, and 2-phenyl-4-methylimidazole.

During the experiment, the addition of one fluororesin micropowder filler, such as polytetrafluoroethylene, into the epoxy resin composition for printed circuit boards can notably decrease the water absorption of the materials, improve the processability of the laminates, and increase the CAF-resistance thereof. Thus the epoxy resin composition of the present invention further comprises fluororesin micropowder fillers. The fluororesin of the fluororesin micropowder filler is the homopolymer of the monomer $-\!\!\left(C_2F_xH_{4-x-y}Cl_y\right)\!\!-_m$ or copolymer of $-\!\!\left(C_2F_xH_{4-x-y}Cl_y\right)\!\!-_m$ and $-\!\!\left(C_aF_bH_c(OCH_3)_{2a-b-c}\right)\!\!-_n$, wherein x=1-4; y=0-3; m is an integer of greater than or equal to 1; a and n are the integers of greater than or equal to 1; b and c are the integers of greater than or equal to 0; 2a–b–c>0. Said fluororesin is tetrafluoroethylene resin, tetrafluoroethylene-perfluoro alkoxyethylene copolymer resin, tetrafluoroethylene-hexafluoropropylene copolymer resin, tetrafluoroethylene-ethylene copolymer resin, vinylidene fluoride resin, trifluorochloroethylene resin or ethylene-trifluorochloroethylene resin. The fluororesin micropowder filler has an average particle size of 0.1-50 μm, preferably 0.5-20 μm. The fluororesin micropowder filler is added in an amount of preferably 10-40%. In order to improve binding power between the fluororesin micropowder and the resin composition and the adhesiveness between the resin and copper foils, the fluororesin micropowder may be surface-treated, wherein the surface treatment is selected from the group consisting of treatment with a fluorine-containing coupling agent, modification by molten potassium acetate or by sodium-naphthalene solution.

The inorganic filler is selected from the group consisting of aluminium hydroxide, magnesium hydroxide, zeolites, wollastonite, silica, magnesia, calcium silicate, calcium carbonate, clay, bodhmite, talc and mica, or a mixture thereof. The solvent is at least selected from the group consisting of hexane, heptane, nonane, decane, dodecane, gasoline, kerosene and cyclohexanone.

The epoxy resin composition of the present invention may be made into a prepreg by dipping or a coated substance by coating. The prepreg or coated substance manufactured from the epoxy resin composition has low water absorption and better CAF resistance.

The copper clad laminated manufactured by using the epoxy resin composition includes a prepreg and copper foils covering two sides of the prepreg, the prepreg comprising a reinforced material and the epoxy resin composition which is adhered to the reinforced material after dipping and drying. The reinforced material is selected from the group consisting of natural fibers, organic synthetic fibers, organic fabrics and inorganic fibers, e.g. glass fiber cloth.

The present invention is detailedly illustrated as follows, but is not limited within the scope of the examples.

Example 1

100 parts by weight of brominated bisphenol A-type epoxy resin (Dow Chemical, having an epoxy equivalent of 435, a bromine content of 19%, a product name of DER530), 24 parts by weight of linear phenolic resin (Gunei Chemical Industry Co., having a hydroxy equivalent of 105 and a product name of TD2090), 0.05 part by weight of 2-methylimidazole, and 10 parts by weight of PTFE resin micropowder were dissolved in N,N-dimethylformamide and cyclohexanone solution to formulate a 65 wt. % of varnish for dipping glass fiber cloth, to form a prepreg by heating and drying. Copper foils were used to cover both sides of the prepreg, pressed and heated to obtain a copper clad laminate.

Example 2

100 parts by weight of brominated bisphenol A-type epoxy resin (Dow Chemical, having an epoxy equivalent of 435, a bromine content of 19%, a product name DER530), 24 parts by weight of linear phenolic resin (Gunei Chemical Industry Co., having a hydroxy equivalent of 105 and a product name of TD2090), 0.05 part by weight of 2-methylimidazole, and 20 parts by weight of PTFE resin micropowder were dissolved in N,N-dimethylformamide and cyclohexanone solution to formulate a 65 wt. % of varnish for dipping glass fiber cloth, to form a prepreg by heating and drying. Copper foils were used to cover both sides of the prepreg, pressed and heated to obtain a copper clad laminate.

Example 3

100 parts by weight of brominated bisphenol A-type epoxy resin (Dow Chemical, having an epoxy equivalent of 435, a bromine content of 19%, a product name of DER530), 24 parts by weight of linear phenolic resin (Gunei Chemical Industry Co., having a hydroxy equivalent of 105 and a product name of TD2090), 0.05 part by weight of 2-methylimidazole, and 30 parts by weight of PTFE resin micropowder were dissolved in N,N-dimethylformamide and cyclohexanone solution to formulate a 65 wt. % of varnish for dipping glass fiber cloth, to form a prepreg by heating and drying. Copper foils were used to cover both sides of the prepreg, pressed and heated to obtain a copper dad laminate.

Example 4

100 parts by weight of brominated bisphenol A-type epoxy resin (Dow Chemical, having an epoxy equivalent of 435, a bromine content of 19%, a product name of DER530), 24 parts by weight of linear phenolic resin (Gunei Chemical Industry Co., having a hydroxy equivalent of 105 and a product name of TD2090), 0.05 part by weight of 2-methylimidazole, and 40 parts by weight of PTFE resin micropowder were dissolved in N,N-dimethylformamide and cyclohexanone solution to formulate a 65 wt. % of varnish for dipping glass fiber cloth, to form a prepreg by heating and drying. Copper foils were used to cover both sides of the prepreg, pressed and heated to obtain a copper clad laminate.

Example 5

100 parts by weight of brominated bisphenol A-type epoxy resin (Dow Chemical, having an epoxy equivalent of 435, a bromine content of 19%, a product name of DER530), 24 parts by weight of linear phenolic resin (Gunei Chemical Industry Co., having a hydroxy equivalent of 105 and a product name of TD2090), OMS part by weight of 2-methylimidazole, and 50 parts by weight of PTFE resin micropowder were dissolved in N,N-dimethylformamide and cyclohexanone solution to formulate a 65 wt. % of varnish for dipping glass fiber cloth, to form a prepreg by heating and drying. Copper foils were used to cover both sides of the prepreg, pressed and heated to obtain a copper clad laminate.

Comparative Example 1

100 parts by weight of brominated bisphenol A-type epoxy resin (Dow Chemical, having an epoxy equivalent of 435, a bromine content of 19%, a product name of DER530), 24 parts by weight of linear phenolic resin (Gunei Chemical Industry Ca, having a hydroxy equivalent of 105 and a product name of TD2090), and 0.05 part by weight of 2-methylimidazole were dissolved in N,N-dimethylformamide to formulate a 65 wt. % of varnish for dipping glass fiber cloth, to form a prepreg by heating and drying. Copper foils were used to cover both sides of the prepreg, pressed and heated to obtain a copper clad laminate.

Example 6

100 parts by weight of brominated bisphenol A-type epoxy resin (Dow Chemical, having an epoxy equivalent of 435, a bromine content of 19%, a product name DER530), 3 parts by weight of dicyandiamide, 0.05 part by weight of 2-methylimidazole, and 10 parts by weight of ETFE resin micropowder were dissolved in N,N-dimethylformamide and cyclohexanone solution to formulate a 65 wt. % of varnish for dipping glass fiber cloth, to form a prepreg by heating and drying. Copper foils were used to cover both sides of the prepreg, pressed and heated to obtain a copper clad laminate.

Example 7

100 parts by weight of brominated bisphenol A-type epoxy resin (Dow Chemical, having an epoxy equivalent of 435, a bromine content of 19%, a product name of DER530), 3 parts by weight of dicyandiamide, 0.05 part by weight of 2-methylimidazole, and 20 parts by weight of ETFE resin micropowder were dissolved in N,N-dimethylformamide and cyclohexanone solution to formulate a 65 wt. % of varnish for dipping glass fiber cloth, to form a prepreg by heating and drying. Copper foils were used to cover both sides of the prepreg, pressed and heated to obtain a copper clad laminate.

Example 8

100 parts by weight of brominated bisphenol A-type epoxy resin (Dow Chemical, having an epoxy equivalent of 435, a bromine content of 19%, a product name of DER530), 3 parts by weight of dicyandiamide, 0.05 part by weight of 2-methylimidazole, and 30 parts by weight of ETFE, resin micropowder were dissolved in N,N-dimethylformamide and cyclohexanone solution to formulate a 65 wt. % of varnish for dipping glass fiber cloth, to form a prepreg by heating and drying. Copper foils were used to cover both sides of the prepreg, pressed and heated to obtain a copper clad laminate.

Example 9

100 parts by weight of brominated bisphenol A-type epoxy resin (Dow Chemical, having an epoxy equivalent of 435, a bromine content of 19%, a product name of DER530), 3 parts by weight of dicyandiamide, 0.05 part by weight of 2 methylimidazole, and 40 parts by weight of ETFE resin micropowder were dissolved in N,N-dimethylformamide and cyclohexanone solution to formulate a 65 wt. % of varnish for dipping glass fiber cloth, to form a prepreg by heating and drying. Copper foils were used to cover both sides of the prepreg, pressed and heated to obtain a copper clad laminate.

Example 10

100 parts by weight of brominated bisphenol A-type epoxy resin (Dow Chemical, having an epoxy equivalent of 435, a bromine content of 19%, a product name of DER530), 3 parts by weight of dicyandiamide, 0.05 part by weight of 2-methylimidazole, and 50 parts by weight of ETFE resin micropowder were dissolved in N,N-dimethylformamide and cyclohexanone solution to formulate a 65 wt. % of varnish for dipping glass fiber cloth, to firm a prepreg by heating and drying. Copper fails were used to cover both sides of the prepreg, pressed and heated to obtain a copper clad laminate.

Comparative Example 2

100 parts by weight of brominated bisphenol A-type epoxy resin (Dow Chemical, having an epoxy equivalent of 435, a bromine content of 19%, a product name of DER530), 3 parts by weight of dicyandiamide, and 0.05 part by weight of methylimidazole were dissolved in N,N-dimethylformamide to formulate a 65 wt. % of varnish for dipping glass fiber cloth, to form a prepreg by heating and drying. Copper foils were used to cover both sides of the prepreg, pressed and heated to obtain a copper clad laminate.

TABLE 1

Comparison of water absorption of the copper clad laminates manufactured according to Examples 1-5 and Comparative Example 1

| Performance | Conditions | Example 1 | Example 2 | Example 3 | Example 4 | Example 5 | Com. Example 1 |
|---|---|---|---|---|---|---|---|
| Water absorption | E-1/105 105 KPa/120 min | 0.26% | 0.26% | 0.23% | 0.22% | 0.21% | 0.28% |

TABLE 2

Comparison of water absorption of the copper clad laminates manufactured
according to Examples 6-10 and Comparative Example 2

| Performance | Conditions | Example 6 | Example 7 | Example 8 | Example 9 | Example 10 | Com. Example 2 |
|---|---|---|---|---|---|---|---|
| Water absorption | E-1/105 105 KPa/120 min | 0.41% | 0.40% | 0.38% | 0.36% | 0.35% | 0.44% |

The aforesaid measuring methods are as follows.

1. Water absorption: the laminates of 100 mm*100 mm*1.6 mm was placed in a oven and dried at 105° C. for 1 h, cooled and weighed, boiled at a steam pressure of 105 KPa, dried up and weighed to calculate the water absorption.

2. CAF performance: measuring according to IPC-TM-650 2.6.2 under the conditions of a temperature of 85° C., a humidity of 85% RH a time period of 96 h, wherein the measuring conditions are at a receiving state.

Figure 2:
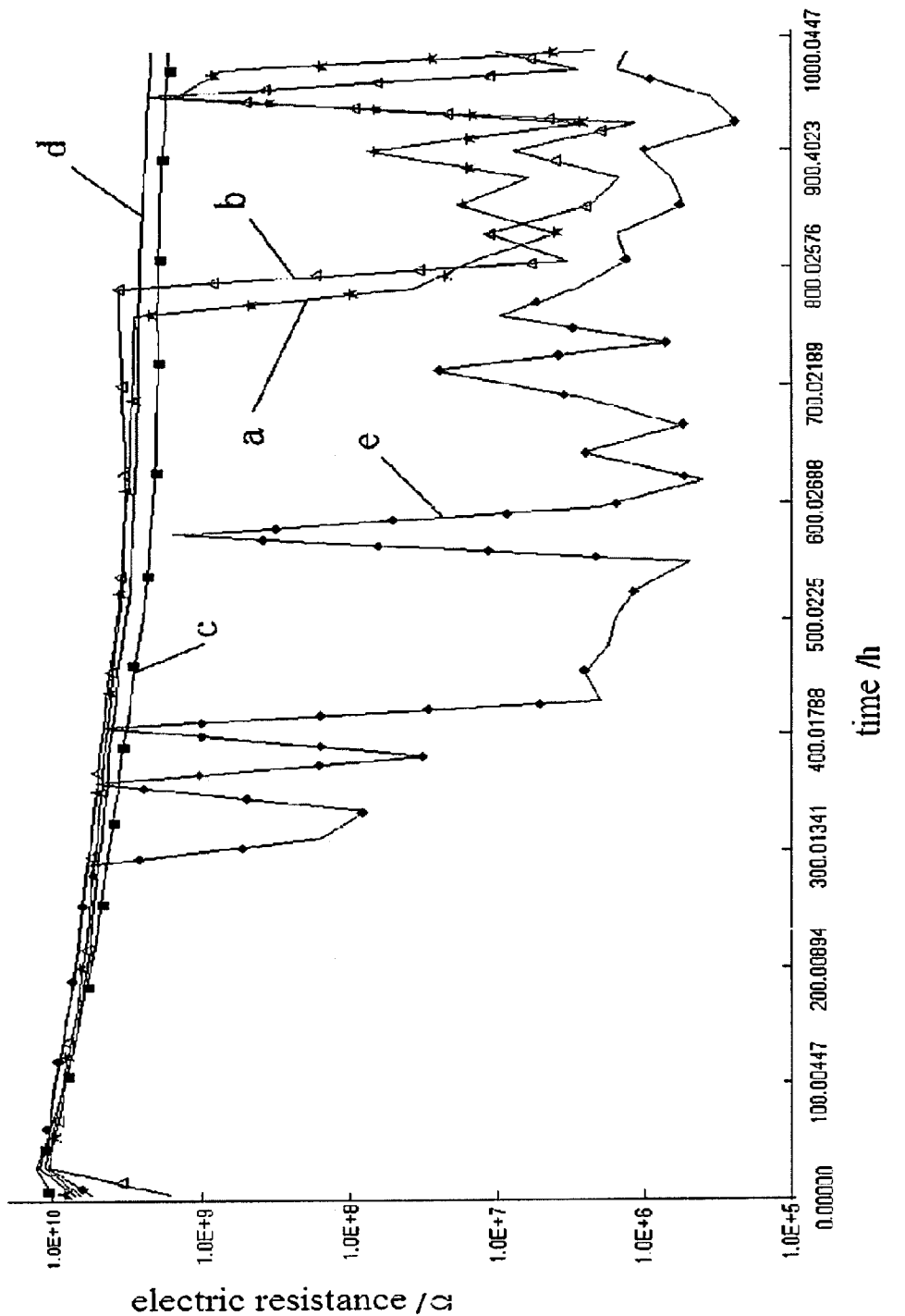
FIG. 2 shows the graphic chart of the relations between the CAF-resistance of the copper clad laminate in the phenolic aldehyde curing system and the addition amount of the fluororesin micropowder filler.
Figure 3:
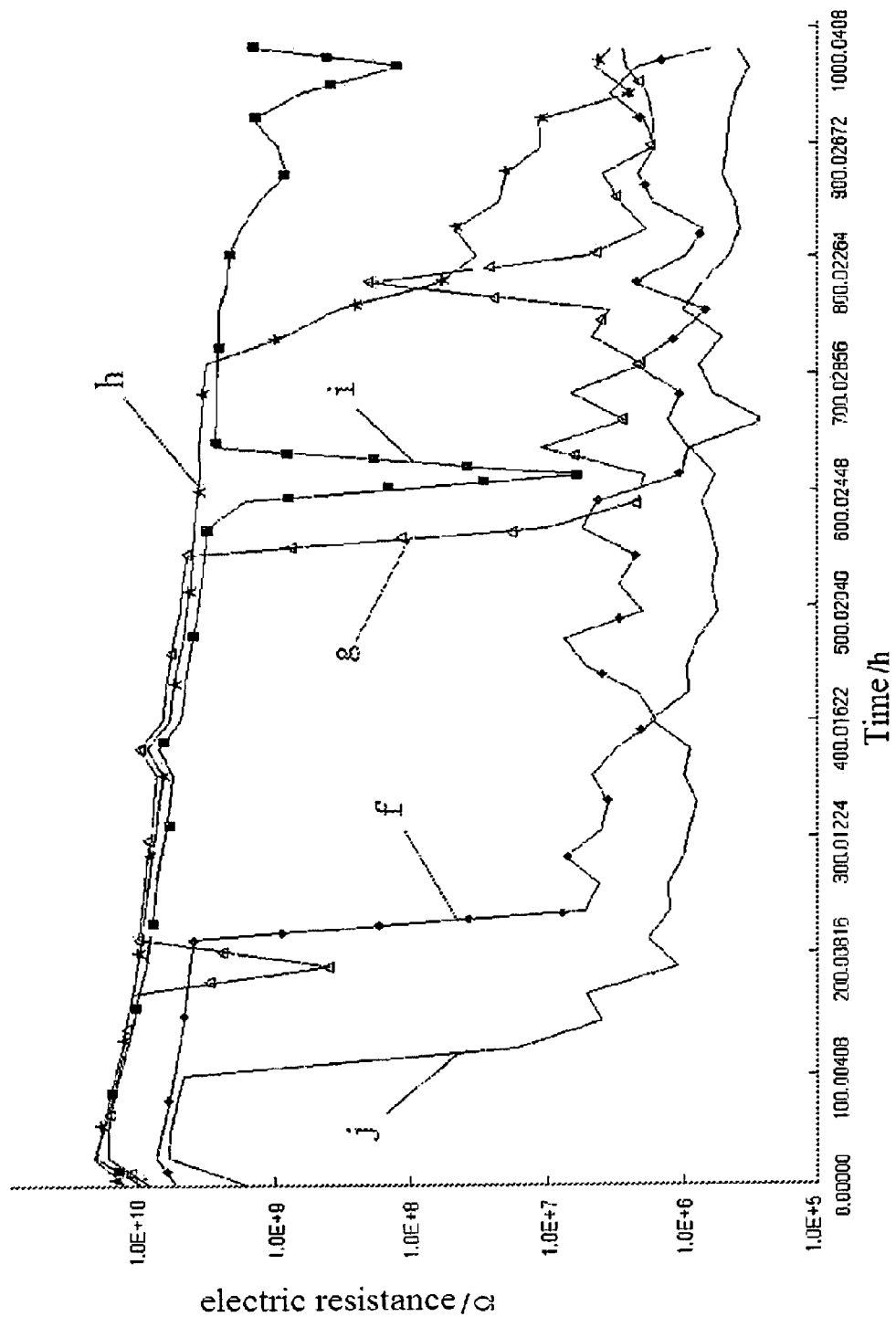
FIG. 3 shows the graphic chart of the relations between the CAF-resistance of the copper clad laminate in the dicyandiamide curing system and the addition amount of the fluororesin micropowder filler.

By combining Tables 1-2 with FIG. 1, it can be seen therefrom that the water absorption of the laminate (copper clad laminate) decreases along with the increase of the addition amount of the fluororesin micropowder filler, so as to show that the addition of the fluororesin micropowder filler may effectively decrease the water absorption of the laminate. According to the test results, the processability of the copper clad laminate is obviously improved along with the increase of the addition amount of PTFE micropowder. By reference to FIGS. 2 and 3 which respectively show the graphic chart of the relations between the CAF-resistance of the copper clad laminate in the phenolic aldehyde curing system and dicyandiamide curing system and the addition amount of the fluororesin micropowder filler (a-e respectively represent Examples 1-4 and Comparative Example 1; f-j respectively represent Examples 6-9 and Comparative Example 2). It can be seen from the figures that the CAF-resistance of the resultant copper clad laminate increases along with the increase of the addition amount of the fluororesin micropowder filler.

In conclusion, the epoxy resin composition of the present invention is manufactured by adding the fluororesin micropowder filler. The resultant epoxy resin composition may notably decrease the water absorption of the composite material manufactured by using the same, improve the processability of the composite material, and increase the CAF-resistance of the composite material. In addition, the copper clad laminate manufactured by using such epoxy resin composition has excellent comprehensive performance, low water absorption, conductive anodic-filament resistance and good processability and meets requirements for processing an assembling of printed circuit boards.

The aforesaid examples are not used to limit the content of the composition of the present invention. Any minute amendment, identical change and modification to said examples according to the technical essence or the parts by weight or content of the composition of the present invention still fall within the scope of the technical solution of the present invention.

The invention claimed is:

1. An epoxy resin composition, comprising the following components and weight percentages thereof: brominated bisphenol A epoxy resin 20-70%, curing agent 1-30%, accelerator 0-10%, fluororesin micropowder filler 1-60%, and inorganic filler 0-60%, and further comprising a suitable amount of solvent, wherein the fluororesin of the fluororesin micropowder filler is the homopolymer of the monomer $-(C_2F_xH_{4-x-y}Cl_y)-_m$ or copolymer of $-(C_2F_xH_{4-x-y}Cl_y)-_m$ and $-(C_aF_bH_c(OCH_3)_{2a-b-c})-_n$, wherein x=1-4; y=0-3; m is an integer of greater than or equal to 1; a and n are the integers of greater than or equal to 1; b and c are the integers of greater than or equal to 0; 2a−b−c≥0; said fluororesin is tetrafluoroethylene resin, tetrafluoroethylene-perfluoro alkoxyethylene copolymer resin, tetrafluoroethylene-hexafluoropropylene copolymer resin, tetrafluoroethylene-ethylene copolymer resin, vinylidene fluoride resin, trifluorochloroethylene resin or ethylene-trifluorochloroethylene resin;

wherein the fluororesin micropowder filler has an average particle size of 0.1-50 μm;

wherein the fluororesin micropowder filler is subjected to a surface treatment, where the surface treatment is selected from the group consisting of treatment with a fluorine-containing coupling agent, modification by molten potassium acetate or by sodium-naphthalene solution; and wherein the solvent is at least selected from the group consisting of hexane, heptane, nonane, decane, dodecane, gasoline, kerosene and cyclohexanone.

2. The epoxy resin composition according to claim 1, wherein the fluororesin micropowder filler has an average particle size of 0.5-20 μm.

3. The epoxy resin composition according to claim 1, wherein the fluororesin micropowder filler is added in an amount of 10-40% by weight, based on the total weight of the epoxy resin composition.

4. A copper clad laminate manufactured by using the epoxy resin composition according to claim 1, wherein including a prepreg and copper foils covering two sides of the prepreg, the prepreg comprising a reinforced material and the epoxy resin composition which is adhered to the reinforced material after impregnating and drying.

5. The copper clad laminate according to claim 4, wherein the reinforced material is selected from the group consisting of natural fibers, organic synthetic fibers, organic fabrics and inorganic fibers.

* * * * *